(12) United States Patent
Beiner et al.

(10) Patent No.: US 11,035,889 B2
(45) Date of Patent: Jun. 15, 2021

(54) MEASURING SENSOR, MEASURING DEVICE, DETECTION MODULE, MEASURING METHOD AND CALIBRATION METHOD

(71) Applicant: Energybox Ltd., Hong Kong (HK)

(72) Inventors: Dirk Beiner, Hong Kong (HK); Tommy Wun, Hong Kong (HK); Benson Lo, Hong Kong (HK)

(73) Assignee: ENERGYBOX LTD., Hong Kong (HK)

( * ) Notice: Subject to any disclaimer, the term of this patent is extended or adjusted under 35 U.S.C. 154(b) by 0 days.

(21) Appl. No.: 16/827,477

(22) Filed: Mar. 23, 2020

(65) Prior Publication Data

US 2020/0309823 A1 Oct. 1, 2020

(30) Foreign Application Priority Data

Mar. 26, 2019 (DE) .......................... 102019107736.2

(51) Int. Cl.
*G01R 19/00* (2006.01)
*G01R 15/18* (2006.01)
*G01R 35/00* (2006.01)

(52) U.S. Cl.
CPC ....... *G01R 19/0092* (2013.01); *G01R 15/181* (2013.01); *G01R 15/183* (2013.01); *G01R 35/005* (2013.01)

(58) Field of Classification Search
CPC .............. G01R 19/0092; G01R 15/181; G01R 15/183; G01R 35/005; G01R 35/02

USPC ....................................... 324/127, 126, 76.11
See application file for complete search history.

(56) References Cited

U.S. PATENT DOCUMENTS

| | | | |
|---|---|---|---|
| 8,598,897 B2* | 12/2013 | Nalbant | G01R 27/18 324/691 |
| 9,772,300 B2* | 9/2017 | Pechstein | G01N 27/02 |
| 10,601,264 B2* | 3/2020 | Robertson | H02J 50/10 |
| 2001/0033180 A1* | 10/2001 | Swart | G01R 1/0675 324/754.03 |
| 2011/0148451 A1* | 6/2011 | Swart | G01R 31/2844 324/756.05 |

(Continued)

FOREIGN PATENT DOCUMENTS

WO 2015155326 A1 10/2015

*Primary Examiner* — Giovanni Astacio-Oquendo
(74) *Attorney, Agent, or Firm* — Slater Matsil, LLP

(57) ABSTRACT

A measuring sensor, a measuring device, a detection module, a measuring method and a calibration method are disclosed. In an embodiment a measuring sensor includes at least one inductive current transformer configured to generate an electrical measurement signal dependent on a current flow in a conductor passing through the inductive current transformer, a terminal configured to connect the inductive current transformer to a measuring transducer, wherein the inductive current transformer is electrically connected to at least two terminal contacts of the terminal in order to transmit the electrical measuring signal to the measuring transducer and a detection module connected between the inductive current transformer and the two terminal contacts, wherein the detection module is configured to return a response signal when a retrieval signal is applied to the two terminal contacts.

19 Claims, 3 Drawing Sheets

(56) References Cited

U.S. PATENT DOCUMENTS

2011/0175636 A1\* 7/2011 Swart ................ G01R 1/07371
324/755.05
2016/0084879 A1 3/2016 Luo
2016/0320434 A1 11/2016 Pascal et al.

\* cited by examiner

MEASURING SENSOR, MEASURING DEVICE, DETECTION MODULE, MEASURING METHOD AND CALIBRATION METHOD

CROSS-REFERENCE TO RELATED APPLICATIONS

This application claims the benefit of German Application No. 102019107736.2, filed on Mar. 26, 2019, which application is hereby incorporated herein by reference.

TECHNICAL FIELD

The invention concerns a measuring device for contactless measurement of an electric current in a conductor, as well as various devices and methods for its operation.

BACKGROUND

A large number of devices and methods for contactless measurement of currents are known from the state of the art. Usually current transformers with a ferromagnetic core and at least one coil wound around the core are used for this purpose. The measuring core completely or partially encloses the conductor through which the current flows, so that a measuring current corresponding to the current to be measured is induced in the coil wound around the core. Such current transformers are also known by the English term "current transformer" (CT).

Due to the design of the ferromagnetic core and the number of turns of the coil, such current transformers can be adapted to various applications. For reasons of electrical safety and in order to standardize the subsequent measuring chain, known current transformers usually provide a uniform output signal of, for example, 0 to 0.33 V as a measuring signal, independent of a specific measuring range of the respective current transformer. For example, a signal of 0.25 V can stand for a current flow of 20 A with a first current transformer and 200 A with a second current transformer.

For the conversion of the measurement signal into a specific measured value, it is therefore necessary to set an appropriate scaling factor or other conversion value. Such values are typically set manually during measurement or installation of the current transformer. The manual setting of a corresponding conversion value can easily lead to errors, so that especially in complex installations, such as in the area of building monitoring, incorrect conversion values are sometimes used, which in turn leads to subsequent errors in the monitoring and control of power supply systems.

SUMMARY

Embodiments provide further improvements to known measuring devices and methods in order to avoid or at least reduce possible sources of error in the contactless measurement of currents in a conductor.

According to a first aspect, the above mentioned problem is solved by a measuring sensor comprising at least one inductive current transformer for generating an electrical measuring signal depending on a current flow in a conductor passed through the inductive current transformer and a terminal for connecting the current transformer to a measuring transformer. In this respect, the inductive current transformer is electrically connected to at least two connecting contacts of the terminal in order to transmit the electrical measuring signal to the measuring transducer. The measuring transformer further comprises a detection module connected between the inductive current transformer and the two terminal contacts, which returns a response signal when a retrieval signal is applied to the two terminal contacts, for example, by a detection device of the measuring transformer, the response signal being specific to a measuring range of the inductive current transformer. Such a measuring sensor enables the automatic determination of a measuring range of a current transformer installed in a measuring sensor and thus an error-free selection of a suitable conversion value.

In at least one configuration, the response signal is specific for the type of current transformer or measuring sensor.

In at least one configuration, the detection module comprises at least one resistance element so that when a test voltage is applied as a retrieval signal, a current flow through the measuring sensor or a voltage drop between the two connection contacts is returned as a response signal. Such a detection module is particularly easy and inexpensive to implement and permits a particularly simple circuitry differentiation between different measuring sensors or current transformers installed in them. Preferably, the detection module comprises two resistors of the same size, which connect the two terminal contacts symmetrically with the inductive current transformer.

According to an alternative configuration, the detection module comprises at least one microchip, wherein the microchip, after applying a supply voltage as an retrieval signal, generates at least one digital response signal in which at least one parameter of the current transformer is encoded. Such an arrangement allows in particular the transmission of different values and/or complex profiles of the current transformer connected to the detection module. For example, at least one of the following parameters may be encoded in the digital response signal: a measuring range of the current transformer, a characteristic of the current transformer, a type code of the current transformer or of the measuring sensor and/or a serial or part number of the current transformer or of the measuring sensor.

The measuring sensor according to the first aspect can be, for example, a clamp-on ammeter with a separable magnetic core, a current measuring coil with a closed, so-called "solid core" ferrite core or a Rogowski coil with an air core.

According to a second aspect, the above mentioned problem is solved by a measuring device for contactless measurement of an electric current in a conductor. The measuring device comprises an inductive current transformer as well as a measuring transducer for reading out an electrical measuring signal generated by the inductive current transformer. The measuring device comprises an inductive current transformer and a measuring transducer for reading out an electrical measuring signal generated by the inductive current transformer. The measuring device further comprises a detection module connected between the inductive current transformer and the measuring transducer, which returns a response signal when a retrieval signal is applied, the response signal being specific to the measuring range of the inductive current transformer.

Such a measuring device represents a complete measuring chain for the measuring sensor according to the first aspect.

In at least one configuration, the current transformer and the detection module are structurally combined in one measuring sensor, and the measuring sensor is connected to the measuring transducer via a plug connector. Such a design excludes possible confusion during installation of the measuring device on the one hand, and on the other hand allows flexible adaptation of the measuring device to different measuring ranges by changing the measuring sensor.

In at least one configuration, the measuring device further comprises a memory device for storing a plurality of profiles for a plurality of current transformers, wherein during operation of the measuring device, a profile specific to the current transformer connected to the measuring transformer is called up from the memory device as a function of the response signal. Such a solution allows in particular the use of a plurality of different current transformers and optionally also the subsequent integration of further types of current transformers into an existing measuring system.

According to a third aspect, a detection module is disclosed for identifying a current transformer in a measuring device according to the second aspect. The detection module comprises at least one terminal contact for connecting the detection module to an input terminal of a measuring transducer and at least one electronic component which provides a response signal at the terminal contact in response to a retrieval signal received via the terminal contact. Such a detection module is particularly suitable for integration into a measuring sensor according to the first aspect or for connection upstream of conventional current transformers without a built-in detection module.

In at least one configuration, the detection module comprises a data processing element and a non-volatile memory device, the data processing element being set up to retrieve at least one parameter from the non-volatile memory device in response to the retrieval signal and to provide it as an encoded response signal for the measuring transducer.

According to a fourth aspect, a measuring method for contactless measurement of an electric current flow in a conductor is disclosed with the following steps: applying a retrieval signal to an input terminal of a measuring transducer; detecting a response signal generated by a detection module connected to the input terminal; determining a measuring range of the current transformer in dependence of the response signal; detecting by the measuring transducer an electrical measurement signal generated by an inductive current transformer connected to the input terminal, the electrical measurement signal being generated in dependence on a current flow in a conductor passing through the inductive current transformer; and determining a measured value for the current flow in the conductor depending on the determined measuring range and the electrical measuring signal.

Such a measuring method allows a fully automatic and error-free determination of a measured value in a contactless measurement of a current.

According to a configuration, the step of determining the measuring range of the current transformer comprises the following substeps: determining a type and/or a serial number of the current transformer connected to the input terminal of the current transformer based on the read-out response signal; and retrieving a profile specific to the current transformer from a memory device. Such a method is particularly flexible and can be implemented by a relatively simple detection module.

According to a fifth aspect, a calibration method for a measuring sensor comprising an inductive current transformer and a recognition module is disclosed with the following steps: connecting the measuring sensor to a calibration device; generating at least one known reference current in a conductor passing through the inductive current transformer; determining at least one electrical measurement signal of the current transformer for the at least one known reference current; determining a profile for the inductive current transformer as a function of the at least one determined measurement signal and the at least one known reference current; and associating the specific profile with a value of the detection module.

The calibration method according to the fifth aspect is used in particular to characterize a measuring sensor according to the first aspect before first use. Such a procedure is carried out directly by the measuring sensor manufacturer, for example, and thus prevents possible errors when the measuring sensor is used by a user.

In at least one configuration a non-volatile memory device is integrated into the measuring sensor and in the associating step at least a part of the specified profile is stored in the non-volatile memory device. Such a system allows direct storage of relevant values in the manufactured measuring sensor.

In at least one configuration, when a retrieval signal is applied, the detection module returns a response signal to the calibration device which identifies a type and/or an identifier of the measuring sensor, and in the step of associating, an entry comprising the type and/or identifier of the measuring sensor and at least part of the specific profile is stored in an external memory device. Such a solution allows in particular the central storage of a plurality of different profiles for a corresponding plurality of different types of measuring sensors.

In at least one configuration, the steps of generating at least one known reference current and determining at least one electrical measurement signal, a plurality of reference currents and associated measurement signals are generated or determined and, in the step of determining a profile, a characteristic curve for the current transformer is determined. Such a configuration enables in particular the recording of complex, non-linear characteristics of measuring sensors

BRIEF DESCRIPTION OF THE DRAWINGS

Further advantageous configurations of the invention are disclosed in the attached patent claims and the following description of examples of embodiments. The invention is described in detail in the following with reference to different examples of embodiments using the attached figures. Therein shows;

DETAILED DESCRIPTION OF ILLUSTRATIVE EMBODIMENTS

Figure 1:
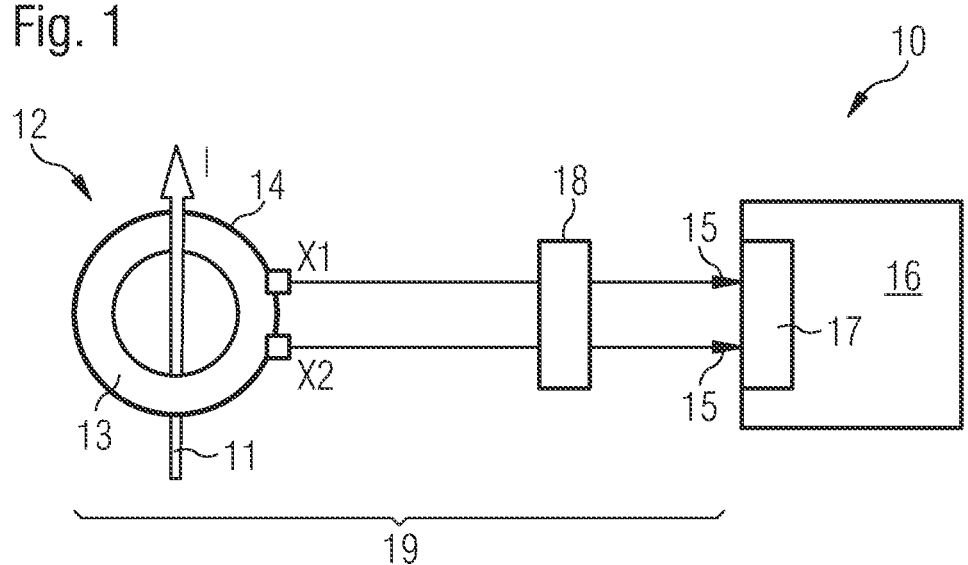
FIG. 1 a possible configuration of a measuring device.

FIG. 1 schematically shows a measuring device 10 for the contactless measurement of a current I in a conductor 11. The conductor 11 is completely or partially surrounded by an inductive current transformer 12, comprising a measuring core 13 and a measuring line 14 wound around the measuring core 13. The wound measuring line 14 forms a measuring coil of the inductive current transformer 12, e.g., measuring core 13 can be a magnetic ferrite core or an air core of a Rogowski coil. Details of such inductive current transformers 12 are known from the state of the art and are not described in detail here.

Regardless of the specific design of current transformer 12, it provides an electrical measuring signal at its connection ends X1 and X2 that is essentially proportional to the current I through conductor 11. In particular, a corresponding measuring current Im is induced in measuring line 14. If the current transformer 12 already includes an internal measuring resistor, the induced measuring current Im can also be converted into a corresponding measuring voltage Um. The magnitude of the induced measuring current Im or the corresponding measuring voltage Um depends on the dimensioning of the measuring core 13 and the number of turns of the measuring cable 14 around the measuring core 13.

The electrical measuring signal applied to terminals X1 and X2 is made available as an analog signal to a measuring transducer 16 via terminal contacts 15. In order to convert the voltage Um or the current Im provided at the terminal contacts 15 into a correct measured value, the measuring transducer 16 requires an indication of the measuring range of the current transformer 12.

In the described embodiment, a detection device 17 of the measuring transducer 16 automatically detects the measuring range of the current transformer 12 by means of a detection module 18. As shown in FIG. 1, the detection module 18 is connected between the current transformer 12 and the detection device 17 of the measuring transducer 16. In the embodiment, current transformer 12 and detection module 18 are structurally combined in a measuring sensor 19, so that subsequent interchanging of current transformer 12 with respect to detection module 18 is impossible. Alternatively, the detection module 18 can also be a device connected between the detection device 17 and the current transformer 12 and separate from them, in particular for retrofitting existing current transformer 12. Likewise, the detection device 17 can also be designed as an independent device. Regardless of these design options, no further connections are required on the side of the measuring transducer 16 for connecting the detection module 18. In response to a retrieval signal injected by the detection device 17, the detection module 18 generates a response signal which is transmitted back to the transmitter 16 via the same connections as the analogue measurement signal.

If no detection module 18 is connected between the measurement transducer 16 and the current transformer 12, automatic detection of the current transformer 12 is not possible, but the measuring device 10 can still be used, if necessary after manual selection of the corresponding measuring range. Thus the described measuring system 10 is downward compatible with existing current transformers.

Figure 2A:
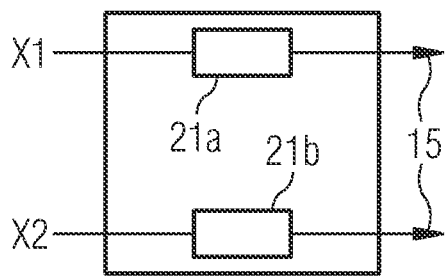
FIG. 2A is a first configuration of a detection module.

FIG. 2A shows a first possible configuration of the detection module 18. In the configuration according to FIG. 2A, two resistors 21a and 21b are serially looped into the two connection lines X1 and X2 of measuring line 14. In the embodiment, the two resistors 21a and 21b are the same size in order to electrically balance the measurement sensor 19. The combined resistance value of resistors 21a and 21b is specific to the measuring range or the type of current transformer 12. The resistance value is preferably selected so that it does not or only slightly distort the electrical measuring signal provided by current transformer 12. This can be achieved, for example, by selecting a resistance value of resistance 21 which is one or more orders of magnitude higher or lower than the internal resistance of the measuring coil formed by measuring line 14. In order to detect a measuring range of current transformer 12, the detection device 17 of measuring transducer 16 can now, for example, apply a voltage of a known magnitude to the connection contacts 15, for example, at the moment of switching on or at regular intervals. As a function of a total resistance of the measuring sensor 19 comprising the current transformer 12 and the detection module 18, a corresponding current flow results from which the type of the installed current transformer 12 can be inferred.

Instead of the resistors 21a and 21b described above, which are connected in series with the current transformer 12, other electrical or electronic components can also be connected in parallel or in series with the current transformer 12, provided that their electrical properties can be read out by a corresponding detection device and used to identify the measuring sensor 12. For example, the capacitance of a capacitor can also be determined for identification purposes.

Figure 2B:
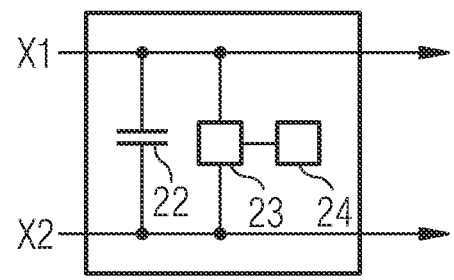
FIG. 2B a second configuration of a detection module.

FIG. 2B schematically shows an alternative configuration of the detection module 18. In the configuration according to FIG. 2B, the detection module 18 comprises an energy storage device 22, a data processing device 23 and a non-volatile memory device 24. All or parts of the above components may be integrated together in a microchip. During operation of the measuring device 10, the energy storage device 22 temporarily stores part of the electrical energy provided by the current transformer 12 and/or the measuring transducer 16. This electrical energy enables the data processing device 23 to retrieve one or more parameters stored in the non-volatile memory device 24, for example, when the supply voltage is first applied. For example, a (maximum) measuring range of the current transformer 12, a characteristic of the current transformer 12, a type code of the current transformer 12 and/or a serial number of the measuring sensor 19 may be stored in the non-volatile memory device 24. The retrieved parameter(s) is (are) transmitted once or regularly to the transmitter 16 in the form of a coded response signal. For example, the coded response signal can be applied as a high-frequency signal over an essentially static or only slowly changing measurement signal.

Figure 3:
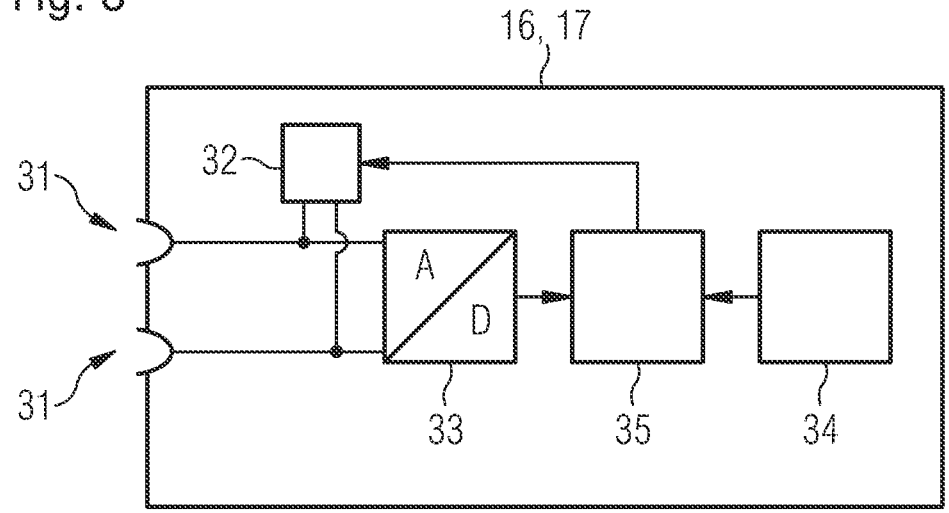
FIG. 3 a possible configuration of a measuring transducer.

FIG. 3 shows a possible configuration of the measuring transducer 16 with a detection device 17 contained therein. In the configuration according to FIG. 3, the measuring transducer 16 comprises two input terminals 31 for connection to corresponding terminal contacts 15 of a measuring sensor 19. Internally, the input terminals 31 are connected to a signaling circuit 32 for generating a retrieval signal and a detection circuit in the form of an analog-to-digital converter (ADC) 33 for detecting a response signal. For example, the signaling circuit 32 can apply a predetermined voltage to the terminals 31 for a short period of time in order to inject a reference voltage into a measuring sensor 19. The reference voltage is used, for example, to read the resistance value of resistors 21a and 21b according to the configuration shown in FIG. 2A or to supply operating energy to energy storage 22 according to the configuration shown in FIG. 2B. Of course, the transmission of more complex retrieval signals, especially digitally coded retrieval signals, is also possible.

By means of the ADC 33, a corresponding response signal of the detection module 18 is detected. As described above, this can be, for example, the determination of a resistance value, a current flow, a voltage drop or the readout of a digitally coded response signal with the current transformer parameters contained therein.

From the response signal, for example, it is possible to infer directly a measuring range and a related conversion value. Alternatively, it is possible that the detection circuit only detects one type or serial number of a transducer and then selects a corresponding conversion value from a conversion table. For example, a corresponding profile for the connected measuring sensor 19 is read out from a corresponding internal or external memory device 34 and fed to a measured value converter in the form of a processor 35 or microcontroller. Subsequently, the measurement converter can convert the digital values provided by the ADC 33 into appropriate measured values by means of the determined conversion value or profile. The further processing of the measured values by downstream elements of transducer 16 is not shown in FIG. 3 and is not described in detail here.

In the configuration according to FIG. 3, the detection device 17 is based on the same components as the measuring circuit of measuring transducer 16. A voltage injected through a switching stage of the signaling circuit 32 results in a current flow through the two series-connected resistors 21a and 21b of the circuit according to FIG. 2A. The processor 35 connected behind the ADC 33 can trigger the injection of the voltage through the signaling circuit 32 and then retrieve a value corresponding to the resulting current flow at the output of the ADC 33. Based on the retrieved value, the processor 35 takes the type class of the measuring sensor 18 from a table stored in the memory device 34. When the type identification is completed, the ADC 33 and processor 35 continue to measure continuously the current values detected by the measuring sensor 18 through the conductor 11.

Figure 4:
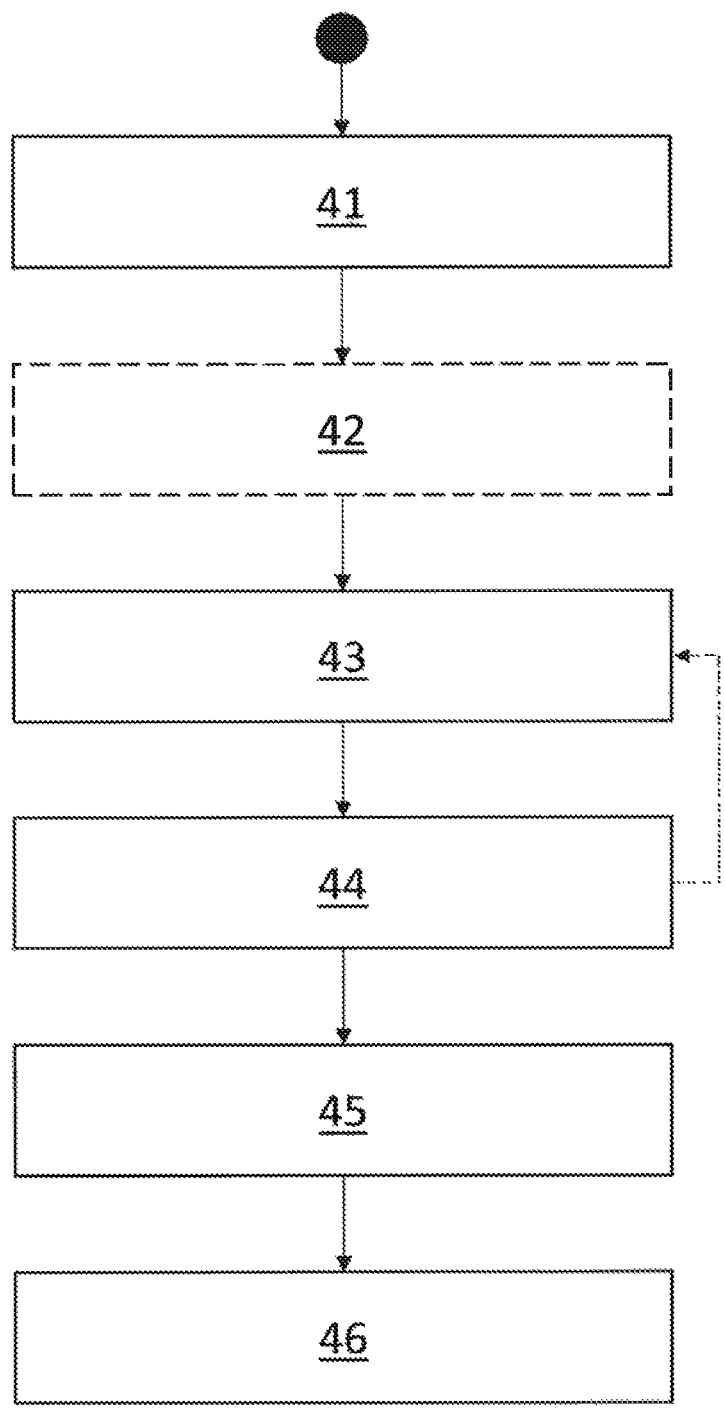
FIG. 4 a flow chart of a calibration method.

FIG. 4 shows schematically the steps of a calibration method for the measuring device 10 according to FIG. 1.

In a first step 41, the measuring sensor 19 comprising the current transformer 12 and the detection module 18 is connected to the input terminals 31 of the measuring transducer 16. In an optional step 42, an identifier of measuring sensor 19 permanently stored in detection module 18 can then be read out. Alternatively or additionally, the type of measuring sensor 19 is recorded as described above. In this phase, the measuring core 13 usually does not surround a conductor 11, or a conductor 11 within the measuring core 13 is not flowed through by a current I. However, the system can also be installed in a running electrical system. For this purpose, the detection device 17 injects a DC voltage into the measuring sensor 19. During the detection phase, the measuring transducer 16 filters out any AC voltage components that may be coupled in through conductor 11 and evaluates only the DC voltage components. Thus, the detection of the measuring sensor 19 is guaranteed even if the current transformer 12 is installed in a running electrical system.

In a further step 43, a known reference current Ir flows through conductor 11 within the measuring core 13, whereupon in step 44 a corresponding electrical measuring signal is generated at terminals X1 and X2 of measuring line 14 and detected by a calibration device. For example, the calibration device can be a special type of transmitter. Steps 43 and 44 can optionally be repeated for different reference currents Ir in order to record a complete characteristic curve of current transformer 12, which also maps non-linearities. Based on the results of steps 43 and 44, a profile is determined in step 45 for the measuring sensor 19 or the current transformer 12 contained therein. The profile can, for example, consist of all measured values or only a certain conversion value or scaling factor. Alternatively, the profile can also contain other parameters, such as a maximum measuring range of current transformer 12.

In a last step 46, the previously determined profile or at least individual values from it are associated with the measuring sensor 19. For this purpose, for example, individual values of the profile can be stored directly in a non-volatile memory device 24 of the detection module 18. Alternatively, it is also possible to store the complete profile together with the identification of the measuring sensor 19 read out in step 42 in a central storage device. The profiles or stored values created by the calibration procedure according to FIG. 4 can subsequently be used for a measurement using the measuring sensor 19 thus characterized.

Figure 5:
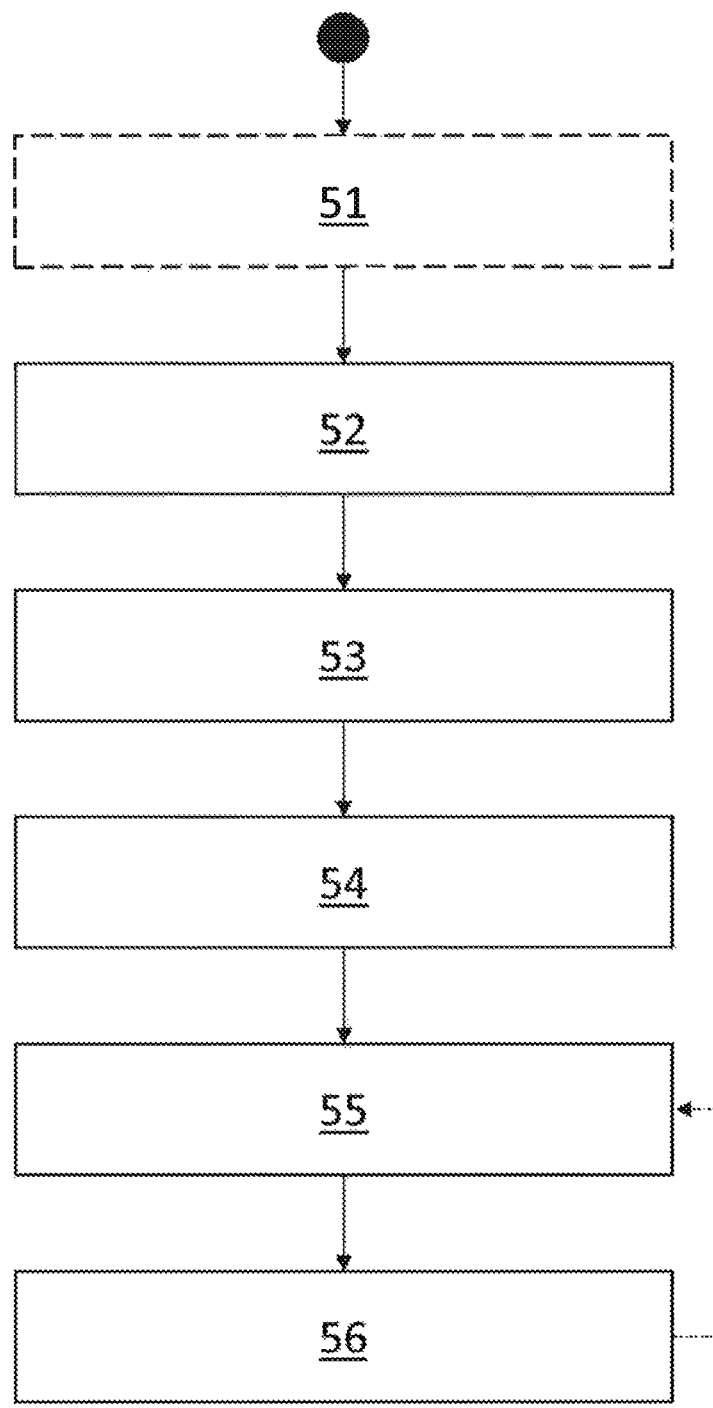
FIG. 5 a flow chart of a measurement method.

FIG. 5 shows schematically the steps of a corresponding measurement procedure.

In a step 51, the measuring sensor 19 comprising the current transformer 12 and the detection module 18 is connected to the input terminals 31 of the measuring transducer 16. In a subsequent step 52, the detection device 17 generates a retrieval signal which is transmitted to the detection module 18. As described above, this can be, for example, the mere application of a DC voltage or the generation of a coded retrieval signal. In a step 53, the detection module 18 responds with a corresponding response signal. This can also be a simple analog signal, such as a predetermined current flow or voltage drop, or a complex, coded response signal.

The response signal contains either information about an identity or a type of the installed current meter 12, which allows an indirect conclusion about the measuring range of the current meter 12, or directly a conversion value required by the measuring transducer 16. Based on this data, a measuring range for the connected current transformer 12 is determined in step 54. If a corresponding conversion value is coded directly into the response signal, it can be acquired in step 54 and stored for further use. If, on the other hand, the response signal only contains an indication of a built-in type, another, possibly external storage device must be queried in step 54 to determine a measuring range or conversion value corresponding to the type of current transformer 12.

Finally, in a step 55, an electrical measuring signal is acquired at an input terminal 31 of the measuring transducer 16, which corresponds to a current I through a conductor 11 within a measuring coil of the current transformer 12. The measuring signal acquired in step 55 is converted into a concrete measured value in step 56. For example, a conversion value determined in step 54 is used for this.

Steps 55 and 56 can be performed continuously or at least repeatedly, for example, to implement continuous monitoring of a circuit. In contrast, steps 51 to 54 need only be repeated when a new measuring sensor 19 is connected to the measuring transducer 16.

The devices and procedures described above allow a largely automatic configuration of a measuring device 10 comprising a measuring transducer 16 and various measuring sensors 19 with differently dimensioned current transformers 12 the measuring sensors 19 being connectable to the measuring transducer 16. The automatic recognition of the current transformer 12 used prevents incorrect configuration of the measuring transducer 16 and thus simplifies and improves an installation process and the operation of the measuring device 10.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A measuring sensor comprising:
    at least one inductive current transformer configured to
        generate an electrical measurement signal dependent on a current flow in a conductor passing through the inductive current transformer;

a terminal configured to connect the inductive current transformer to a measuring transducer, wherein the inductive current transformer is electrically connected to at least two terminal contacts of the terminal in order to transmit the electrical measuring signal to the measuring transducer; and a detection module connected between the inductive current transformer and the two terminal contacts, wherein the detection module is configured to return a response signal when a retrieval signal is applied to the two terminal contacts, the response signal being specific to a measuring range of the inductive current transformer.

2. The measuring sensor according to claim 1, wherein the response signal is specific for a type of the inductive current transformer or the measuring sensor.

3. The measuring sensor according to claim 1, wherein the detection module comprises at least one resistance element so that when a test voltage is applied as the retrieval signal, the current flow through the measuring sensor or a voltage drop between the two terminal contacts is returned as the response signal.

4. The measuring sensor according to claim 3, wherein at least one of the following parameters is encoded in the response signal: the measuring range of the inductive current transformer, a characteristic curve of the inductive current transformer, a type code of the inductive current transformer or the measuring sensor, and/or a serial number or part number of the inductive current transformer or the measuring sensor.

5. The measuring sensor according to claim 1, wherein the detection module comprises at least one microchip, and wherein the microchip is configured to generate at least one digital response signal in which at least one parameter of the inductive current transformer is encoded, after applying a supply voltage as the retrieval signal.

6. The measuring sensor according to claim 1, wherein the inductive current transformer is designed as a clamp-on ammeter and comprises a separable magnetic core and at least one measuring line wound around the separable magnetic core.

7. The measuring sensor according to claim 1, wherein the inductive current transformer is designed as a Rogowski coil and comprises at least one toroidal-shaped measuring line.

8. A measuring device for contactlessly measuring an electric current in a conductor, the measuring device comprising:
   an inductive current transformer;
   a measuring transducer configured to:
      read out an electrical measurement signal generated by the inductive current transformer; and
      determine a measurement value for a current flow in the conductor passing through the inductive current transformer dependent on the read out electrical measurement signal and a measurement range of the inductive current transformer; and
   a detection module connected between the inductive current transformer and the measuring transducer, wherein the detection module is configured to return a response signal when a retrieval signal is applied, the response signal being specific to a measuring range of the inductive current transformer.

9. The measuring device according to claim 8, wherein the inductive current transformer and the detection module are structurally combined in a measuring sensor and the measuring sensor is connected to the measuring transducer via a plug connector.

10. The measuring device according to claim 8, further comprising a memory device configured to store a plurality of profiles for a plurality of inductive current transformers, wherein the measuring device is configure to load a profile specific to the inductive current transformer connected to the measuring transducer from the memory device in dependence on the response signal.

11. A detection module comprising:
   at least one terminal contact configured to connect the detection module to an input terminal of a measuring transducer; and
   at least one electronic component configured to provide a response signal at the terminal contact in response to a retrieval signal obtained via the terminal contact,
   wherein the detection module is configured to identify a current transformer in the measuring device according to claim 8.

12. The detection module according to claim 11, further comprising a data processing element and a non-volatile memory device, wherein the data processing element is configured to load at least one parameter from the non-volatile memory device in response to the retrieval signal and to provide the at least one parameter as an encoded response signal for the measuring transducer.

13. A measuring method for contactlessly measuring an electric current flow in a conductor, the method comprising:
   transmitting, by a measuring transducer, via an input terminal of the measuring transducer a retrieval signal to a detection module;
   detecting, by the measuring transducer, a response signal generated by the detection module connected to the input terminal;
   determining, by the measuring transducer, a measuring range of a current transformer depending on the response signal;
   detecting, by the measuring transducer, an electrical measurement signal generated by the current transformer connected to the input terminal, the electrical measurement signal being generated dependent on a current flow in the conductor passing through the current transformer; and
   determining, by the measuring transducer, a measured value for the current flow in the conductor depending on the determined measuring range and the electrical measuring signal.

14. The measuring method according to claim 13, wherein determining the measuring range of the current transformer comprises:
   determining a type and/or a serial number of the current transformer connected to the input terminal of the measuring transducer based on the response signal; and
   retrieving a profile specific to the current transformer from a memory device.

15. A calibration method comprising:
   connecting a measuring sensor comprising an inductive current transformer and a detection module to a calibration device;
   generating at least one known reference current in a conductor passing through the inductive current transformer;
   determining, by the calibration device, at least one electrical measurement signal of the inductive current transformer for the at least one known reference current;

determining, by the calibration device, a profile for the inductive current transformer depending on the at least one determined measurement signal and the at least one known reference current; and associating, by the calibration device, the determined profile with a value of the detection module.

16. The calibration method according to claim 15, wherein a non-volatile memory device is integrated in the measuring sensor, and wherein the determined profile is stored in the non-volatile memory device.

17. The calibration method according to claim 15, further comprising returning, by the detection module, a response signal to the calibration device upon application of a retrieval signal, the response signal identifying a type and/or identifier of the measuring sensor, wherein an entry is stored in a memory device, the entry comprising the type and/or identifier of the measuring sensor and at least a part of the determined profile.

18. The calibration method according to claim 15, wherein generating at least one known reference current and determining at least one electrical measurement signal comprises generating a plurality of reference currents and associated measurement signals or respectively determining a plurality of reference currents and associated measurement signals.

19. The calibration method according to claim 18, wherein determining the profile comprises determining a characteristic curve for the inductive current transformer.

\* \* \* \* \*